(12) United States Patent
Owen

(10) Patent No.: US 9,213,050 B2
(45) Date of Patent: Dec. 15, 2015

(54) DELAYED METER REPORTING

(75) Inventor: James E. Owen, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 546 days.

(21) Appl. No.: 12/871,791

(22) Filed: Aug. 30, 2010

(65) Prior Publication Data

US 2012/0053869 A1 Mar. 1, 2012

(51) Int. Cl.
*H03F 1/26* (2006.01)
*G01R 21/00* (2006.01)
*G01R 22/06* (2006.01)
*G01R 21/133* (2006.01)

(52) U.S. Cl.
CPC .......... *G01R 22/063* (2013.01); *G01R 21/1333* (2013.01)

(58) Field of Classification Search
USPC .............................................. 702/60–62, 189
See application file for complete search history.

(56) References Cited

U.S. PATENT DOCUMENTS

| | | | | | |
|---|---|---|---|---|---|
| 4,056,774 | A | * | 11/1977 | Shum | 324/142 |
| 4,250,552 | A | * | 2/1981 | Elms | 702/60 |
| 4,463,311 | A | * | 7/1984 | Kobayashi | 324/142 |
| 4,663,587 | A | * | 5/1987 | Mackenzie | 324/141 |
| 4,949,274 | A | * | 8/1990 | Hollander et al. | 324/142 |
| 5,059,896 | A | * | 10/1991 | Germer et al. | 324/142 |
| 5,245,275 | A | * | 9/1993 | Germer et al. | 324/142 |
| 5,289,115 | A | * | 2/1994 | Germer et al. | 324/107 |
| 5,485,393 | A | * | 1/1996 | Bradford | 702/60 |
| 5,545,981 | A | * | 8/1996 | Dubin et al. | 324/142 |
| 5,627,759 | A | * | 5/1997 | Bearden et al. | 702/62 |
| 6,080,927 | A | | 6/2000 | Johnson | |
| 6,262,672 | B1 | * | 7/2001 | Brooksby et al. | 340/870.1 |
| 6,483,291 | B1 | * | 11/2002 | Bhateja et al. | 324/142 |
| 6,618,709 | B1 | * | 9/2003 | Sneeringer | 705/412 |
| 7,020,701 | B1 | * | 3/2006 | Gelvin et al. | 709/224 |
| 7,167,804 | B2 | * | 1/2007 | Fridholm et al. | 702/62 |
| 7,565,227 | B2 | | 7/2009 | Richard et al. | |
| 7,865,252 | B2 | * | 1/2011 | Clayton | 700/19 |
| 8,334,771 | B2 | * | 12/2012 | Matsuyama et al. | 340/541 |

(Continued)

FOREIGN PATENT DOCUMENTS

| | | |
|---|---|---|
| JP | 08-271554 | 10/1996 |
| JP | 2002-152861 | 5/2002 |
| JP | 2007-183890 | 7/2007 |

OTHER PUBLICATIONS

INTRON,"How AMI Enables the Smart Grid," retrieve Internet,URL: <http://www.greentechmedia.com/content/images/sponsored/resource_center/Itron-How-AMI-Enables-the-Smart-Grid.pdf>.

(Continued)

*Primary Examiner* — Sujoy Kundu
*Assistant Examiner* — Alvaro Fortich
(74) *Attorney, Agent, or Firm* — Brooks Acordia IP Law, P.C.; Pejman Yedidsion; David Ripma

(57) ABSTRACT

Systems and devices for, and methods of, delayed meter reporting to a remote site via a local data-gathering device. The local data-gathering device is configured to: (a) sample, at a first sample rate, energy consumption related data of the local site; (b) store, at the data store, energy consumption related data of the local site; (c) filter the stored data based on the defined rule; and (d) transmit, at a second sample rate, the filtered data, wherein the first sampling rate is equal to or higher than the second sampling rate.

20 Claims, 4 Drawing Sheets

(56) References Cited

U.S. PATENT DOCUMENTS

| | | | |
|---|---|---|---|
| 2001/0019321 A1* | 9/2001 | Brooksby et al. | 345/87 |
| 2002/0033416 A1* | 3/2002 | Gerszberg et al. | 235/380 |
| 2003/0042886 A1* | 3/2003 | Gandhi | 324/142 |
| 2003/0158677 A1* | 8/2003 | Swarztrauber et al. | 702/62 |
| 2003/0158826 A1* | 8/2003 | Burke et al. | 705/412 |
| 2004/0024717 A1* | 2/2004 | Sneeringer | 705/412 |
| 2004/0034484 A1 | 2/2004 | Solomita, Jr. et al. | |
| 2004/0232904 A1* | 11/2004 | Gandhi | 324/74 |
| 2005/0137813 A1* | 6/2005 | Swarztrauber et al. | 702/62 |
| 2006/0259254 A1* | 11/2006 | Swarztrauber et al. | 702/64 |
| 2009/0132096 A1* | 5/2009 | Swarztrauber et al. | 700/295 |
| 2009/0198384 A1 | 8/2009 | Ahn | |
| 2009/0309756 A1* | 12/2009 | Mason et al. | 340/870.02 |
| 2009/0326726 A1 | 12/2009 | Ippolito et al. | |
| 2010/0179862 A1* | 7/2010 | Chassin et al. | 705/10 |
| 2010/0217450 A1* | 8/2010 | Beal et al. | 700/291 |
| 2011/0029655 A1* | 2/2011 | Forbes et al. | 709/223 |
| 2011/0113120 A1* | 5/2011 | Johnson et al. | 709/218 |
| 2011/0161022 A1* | 6/2011 | Caird | 702/62 |
| 2011/0270547 A1* | 11/2011 | Shen et al. | 702/60 |
| 2011/0282504 A1* | 11/2011 | Besore et al. | 700/291 |
| 2012/0041696 A1* | 2/2012 | Sanderford et al. | 702/62 |

OTHER PUBLICATIONS

Data Privacy and Data Access, retrieved Internet, URL:<http://www.ilgridplan.org/February%20Workshop%20Documents/Data%20Privacy%20and%20Data%20Access%20-%20Comparison%20Draft.pdf>.

Smart E-Meter:AMR/AMI,Smart Electricity Meter:AMR/AMI Solutions from Texas Instruments, retrieved via Internet,URL:<http://focus.tl com/docs/solution/folders/print/407 html>.

Sawnee EMC, Advanced Metering Infrastructure, AMI Frequently Asked Questions, retrieved from Internet,URL<http://www.sawnee.com/ami/faq.aspx>.

FPL AMI, How Advanced Electronic Meters Work, retrieved from the Internet, URL<http://www.fpl.com/ami/qa.shtml>.

International Search Report for Serial No. PCT/JP2011/070081 mailed Nov. 15, 2011.

\* cited by examiner

DELAYED METER REPORTING

TECHNICAL FIELD

Embodiments pertain to systems and devices for, and methods of, delayed electrical energy and/or power consumption reporting.

BACKGROUND

FIG. 1 is a functional block diagram of a prior art system 100 where an instrumented meter 110, or smart meter, as part of an advanced metering structure (AMI), is depicted as sending energy usage measurements 111, whether comprised of site energy consumption information in general or comprised of individual energy-consuming device information in particular, or both, and doing so on demand 112 to an energy utility 120 in order to provide accounting information 121, e.g., every fifteen minutes to a utility data store 122, for both demand response incentives and time of use incentives. Drawing from the data store 122, the utility can generate 123 a bill or invoice based on the transmitting site's energy usage 124, and optionally based on the applicable incentive policies. Along with this continual flow of energy usage information of private subscribers being provided to a utility comes a concern for maintained privacy and a concern for possible misuse of the information. For example, a person intent on burglary of the reporting site may monitor this flow of information to determine whether anyone is occupying the site. Accordingly, the prior art system fails to provide local site control of the content and frequency of the transmission of the energy consumption-related information.

SUMMARY

Systems and devices for, and methods of, delayed meter reporting to a remote site via a meter responsive to remotely generated prompts and a local data-gathering device. For example, a method embodiment may comprise: (a) storing, at a local data store of a local processing device, energy consumption related data of a local site based on a first sampling rate; (b) filtering, by the local processing device, the stored data based on a defined rule; and (c) transmitting, by the local processing device, the filtered data based on a second sampling rate, wherein the first sampling rate is equal to or higher than the second sampling rate. The energy consumption related data of the local site may comprise at least one of: (i) an instantaneous local site power consumption value; (ii) a total local site energy consumption value; (iii) a local site voltage level; and/or (iv) a local site power factor. The energy consumption related data of the local site may comprise at least one of: (i) the energy consumption value of one or more monitored local devices; (ii) the energy store level of one or more monitored local energy store devices; (iii) the temperature measurements of the local site; (iv) the operational state information of one or more local actuated vents; and (v) the operational state information of one or more local actuated ducts. The defined rule may comprise at least one of: instructions to allow monthly time-of-day power consumption totals for transmission; and instructions to allow daily time-of-day power consumption totals for transmission.

An exemplary system embodiment may include circuitry, a central processing, or a combination of both and a data store comprising a defined rule. For example, the processor may be configured to: (a) sample, at a first sample rate, energy consumption related data of the local site; (b) store, at the data store, energy consumption related data of the local site; (c) filter the stored data based on the defined rule; and (d) transmit, at a second sample rate, the filtered data, wherein the first sampling rate is equal to or higher than the second sampling rate.

BRIEF DESCRIPTION OF THE DRAWINGS

Embodiments are illustrated by way of example and not limitation in the figures of the accompanying drawings, and in which.

DETAILED DESCRIPTION

Figure 1:
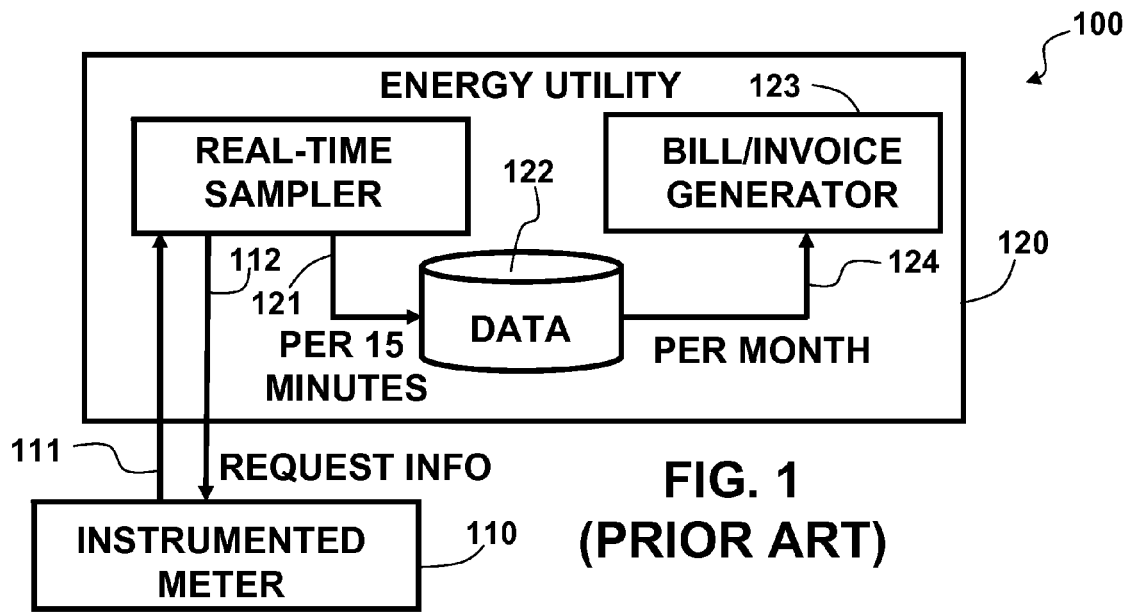
FIG. 1 is a functional block diagram of a prior art system.
Figure 2:
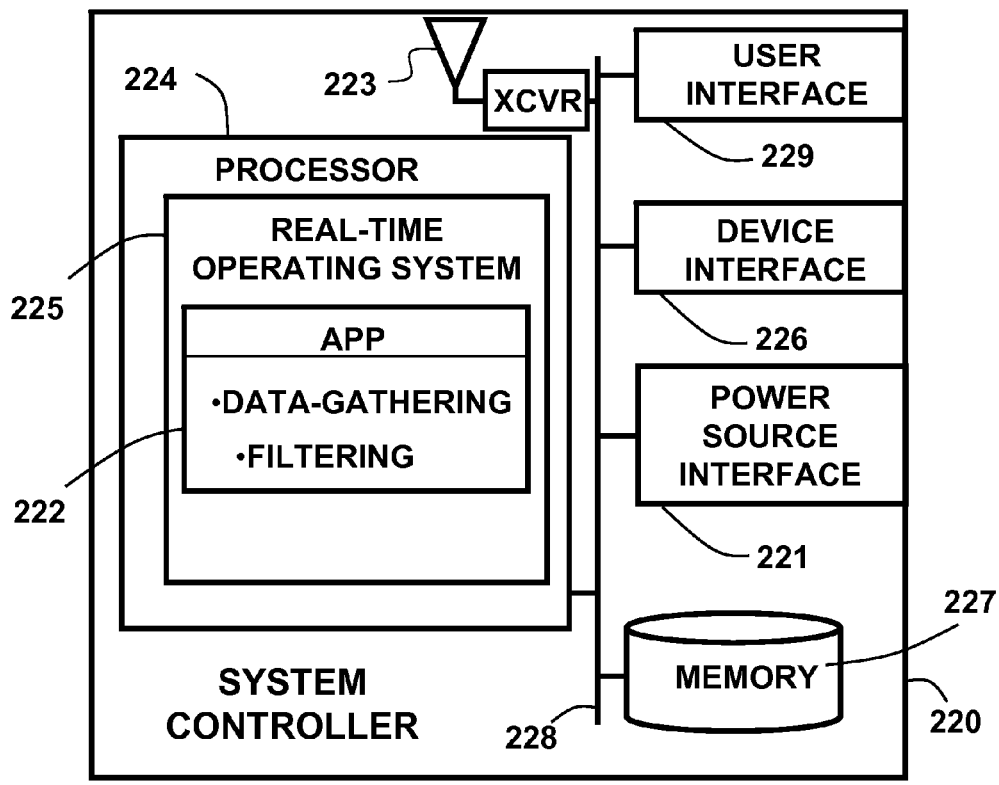
FIG. 2 is a functional block diagram of an exemplary computing device embodiment of the present invention.

Disclosed are systems and devices for, and methods of, delayed meter reporting to a remote site via a local data-gathering device where the data gathering and data filtering functionality may be configured as a computing device in collaboration with, or integrated, with the meter instrumentation. FIG. 2 is a functional block diagram of an exemplary computing device 220 having a processor 224 and memory 227 addressable via a data bus 228. FIG. 2 also depicts the computing device 220 as comprising a user interface 229, a power source interface 221, and a device interface 226 by which one or more local devices may communicate with the processor 224 via the data bus 228. FIG. 2 also depicts the computing device 220 as comprising an optional wireless transceiver (XCVR) and antenna 223. The processor 224 may be configured to execute programmed steps via a real-time operating system 225 where the steps that comprise the application 222 may include energy consumption measurement data gathering and data filtering prior to transmission to a remote site.

The exemplary computing device 220 may function to accumulate the relevant data on the meter or as part of a home energy management system that monitors energy-consuming devices within a network, e.g., a network of energy consuming devices within a site. The data stored locally at the store 227 of the computing device 220 can be much more comprehensive than that which is sent to the utility for billing. For example, the computing device 220 may be configured to store in one-second intervals, power measurements, voltage levels, and power factors, e.g., the real power divided by the total, or complex, power. The computing devices may be configured to store external data such as ambient temperature at the local site, e.g., inside a house and/or outside the house, and the one or more thermostat temperature settings. For example, the computing device may be configured, via for example the transceiver and antenna 223, to track devices that are signed onto, i.e., participating in, a residential Wi-Fi system, thereby allowing the computing device to execute estimating instruction to determine which residents were home within a particular timeframe. This additional data and these additional computations may be applied locally to aid in tracking energy usage. The exemplary computing device may be configured to transmit the information to the utility site only during a billing time that may be part of a billing cycle.

Via the user interface 229, the administrator of the site, e.g., the energy consumer, may configure a filter to limit the optional energy-consuming information that may be transmitted. The device may record at a regular interval such as every 15 minutes. The transmission of data from the device to the utility may be effected on a regular cycle, e.g., the same interval as the recording interval or an interval larger than the recording interval. The transmission of data from the device to the utility may be responsive to a received data query from the utility. The computing device may be configured to decimate the stored information for transmission so that the consumer need not send to the utilities anything that the consumer is not comfortable with releasing. The decimation processing need not be user configurable. The receiving utility provider can offer different incentives for different amounts of information transmitted by the consumer via the filter processing. For example, the utility entity may offer a discount for time of day totals for the month, and yet offer a larger discount for daily totals of time of day statistics.

Figure 3:
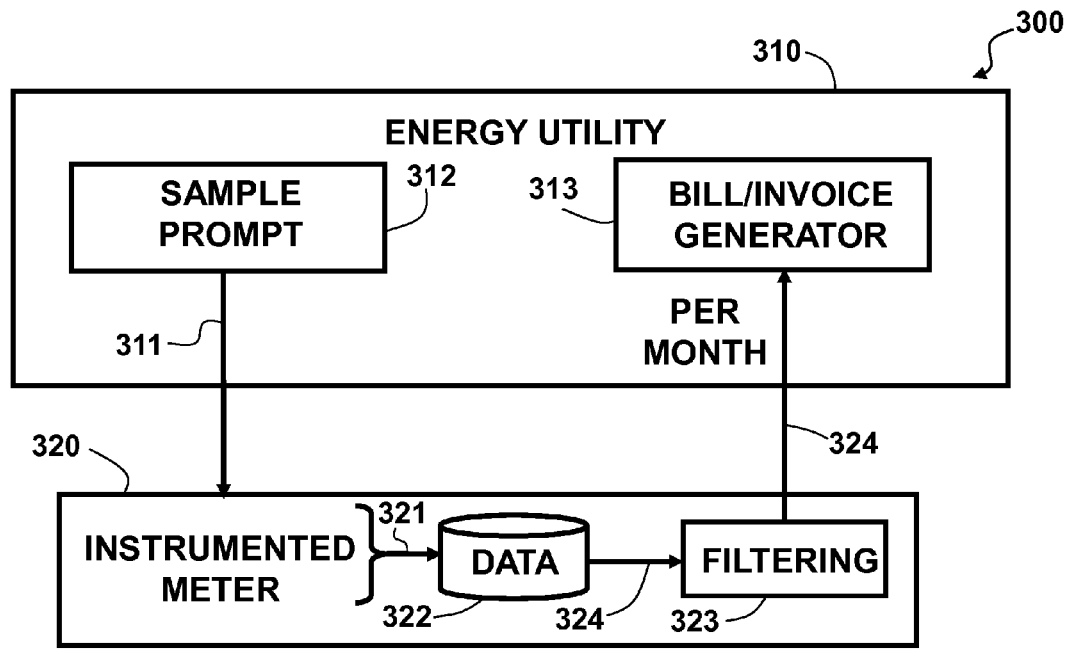
FIG. 3 is a functional block diagram of an exemplary system embodiment.

FIG. 3 depicts an exemplary system 300 embodiment comprising the utility site 310 and the local instrumented meter 320 where the requests 311, e.g., requests or demands of a sampler 312, are depicted as received by the instrumented meter 320. Responsive to the demands 311, the instrumented meter 320 is depicted as providing energy consumption related data 321 to a local data store 322. Energy consumption related data 321 may be provided to the local data store 322 based on local periodic sampling irrespective of a prompt generated by the energy utility. FIG. 3 also depicts local processing, such as that by a computing device integrated with the instrumented meter 320 filtering 323 data 324 extracted from the local data store 322, and depicts the instrumented meter as providing the filtered extracted data 324 to a bill or invoice generator 313 of the energy utility 310 on a periodic basis, e.g., on a monthly basis. The user, e.g., the local site administrator, may enroll with the utility for a specific accounting filter executable by the computing device, or by processing of the instrumented monitor, that provides the energy utility 310 with a limited set of data 324.

An exemplary filtering process may include analog and/or digital signal processing as filtering and/or data consolidation and/or original data decimation so that data set for allowable transmission contains less information than the original data set. Paring the collected data to comprise the transmittable data allows customers at the site to block some data that may otherwise be transmittable, e.g., which appliances were being used and the exact time of day of the usage and/or time slots of the usage of all or of particular appliances. Filter embodiments may allow for the transmission of customer-sensitive information, such as time slots associated with appliance usages, and done so based on a remuneration schedule. In addition, the filtering via signal processing may average the power and/or determine, in a sample time period, a minimum and maximum of the power consumption of one or more appliances, or the entire site.

Figure 4:
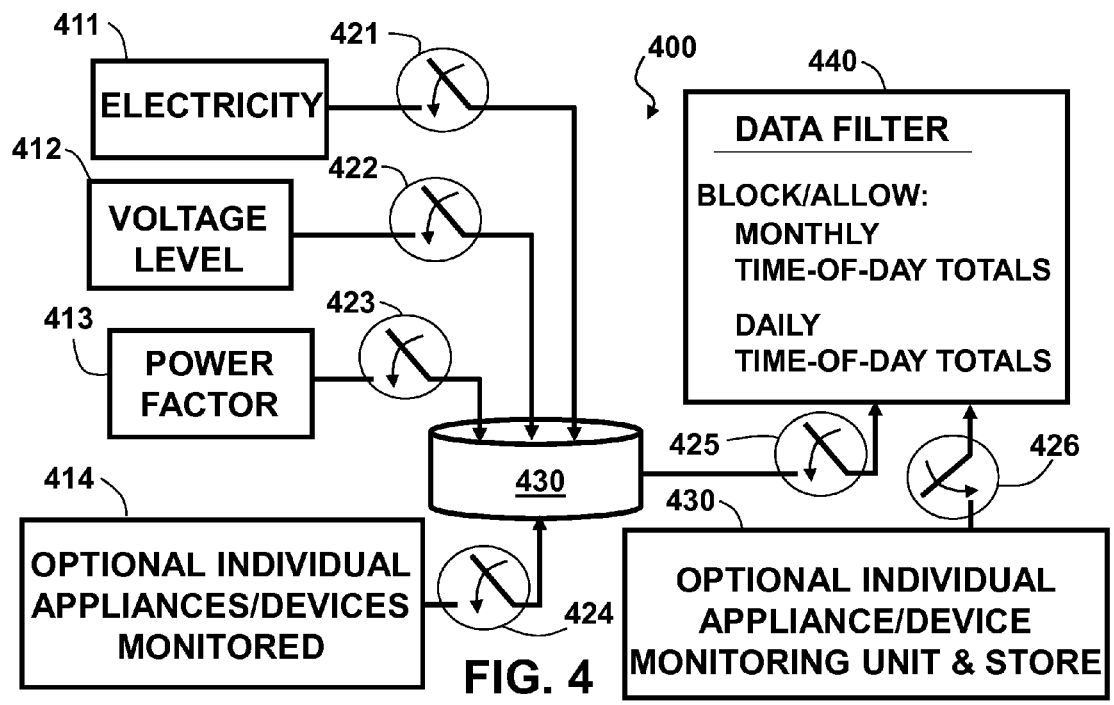
FIG. 4 is a functional block diagram of a portion of an exemplary system embodiment.

FIG. 4 is a functional block diagram of a portion of an exemplary system embodiment where an electricity meter 411 may be sampled for instantaneous power being consumed and or total energy consumed via a first periodic sampler 421 and the sample power consumption data stored in a data store 430. A voltage meter 412 may be sampled for instantaneous voltage levels via a second periodic sampler 422 and the samples stored in the data store 430. The power factor 423, e.g., the resistive power (KW) divided by complex power (VKA), may be derived and sampled periodically via a third periodic sampler 423 and the samples stored in the data store 430. Individual appliances or devices 414, e.g., devices at a local network of a site, may be monitored for total or individual power consumption, and the power consumption, or other operational parameters, may be periodically sampled via a forth sampler 424 where the samples are stored in the data store 430. A data filter 440 or data filtering process may periodically extract data from the data store 430 via a fifth sampler 425. Optionally, the data filter 440 or data filtering process may periodically extract, via a sixth data sampler 426, data from a data store of an auxiliary unit 430 where the data may comprise total or individual power and/or energy consumption, and the power and/or energy consumption, or other operational parameters of individual appliances or devices, e.g., devices at a local network of a site, being monitored by the auxiliary unit 430. Depending on its configuration, the data filter 440 or data filter process may block, or allow for transmission, monthly time-of- day totals, daily time-of-day totals, and/or other data stored on the data store 430 and/or the data store of the auxiliary device 430. The first through fourth samplers 421-424 may be embodied as multiple samplers or multiple sampling operations, or as a combined single sampler or single sampling operation. The fifth and sixth samplers 425, 426 may be embodied as a combined single sampler or single sampling operation. Embodiments include the fifth and sixth samplers 425, 426 having a sampling rate or sampling rates lower than the sampling rate or sampling rates of the first through fourth samplers 421-424.

Figure 5:
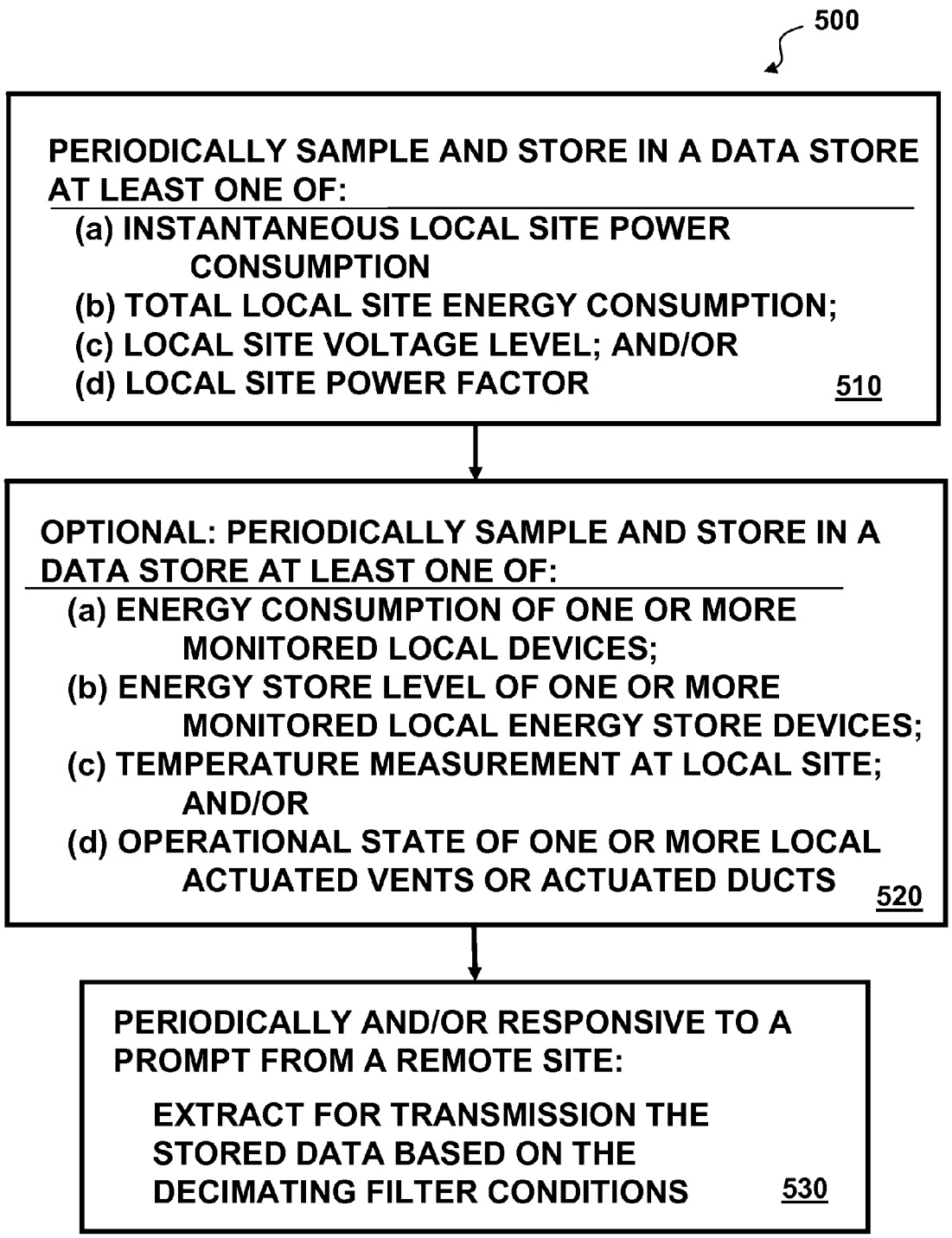
FIG. 5 is a flowchart depicting an exemplary method of operation embodiment.

FIG. 5 is a flowchart 500 depicting an exemplary method of operation embodiment where an exemplary system may periodically sample and store in a data store (step 510) at least one of: (a) instantaneous local site power consumption; (b) total local site energy consumption; (c) local site voltage level; and/or (d) local site power factor. Optionally, an exemplary device or an auxiliary device may periodically sample and store in a second data store (step 520) at least one of: (a) energy consumption of one or more monitored local devices; (b) energy store level of one or more monitored energy store devices; (c) temperature measurement at a local site; and/or (d) an operational state of one or more local actuated vents or actuated ducts. The system periodically, and/or responsive to a prompt from a remote site, extracts for transmission data from the one or more data stores based on filtering conditions, e.g., based on decimating filter conditions.

Figure 6:
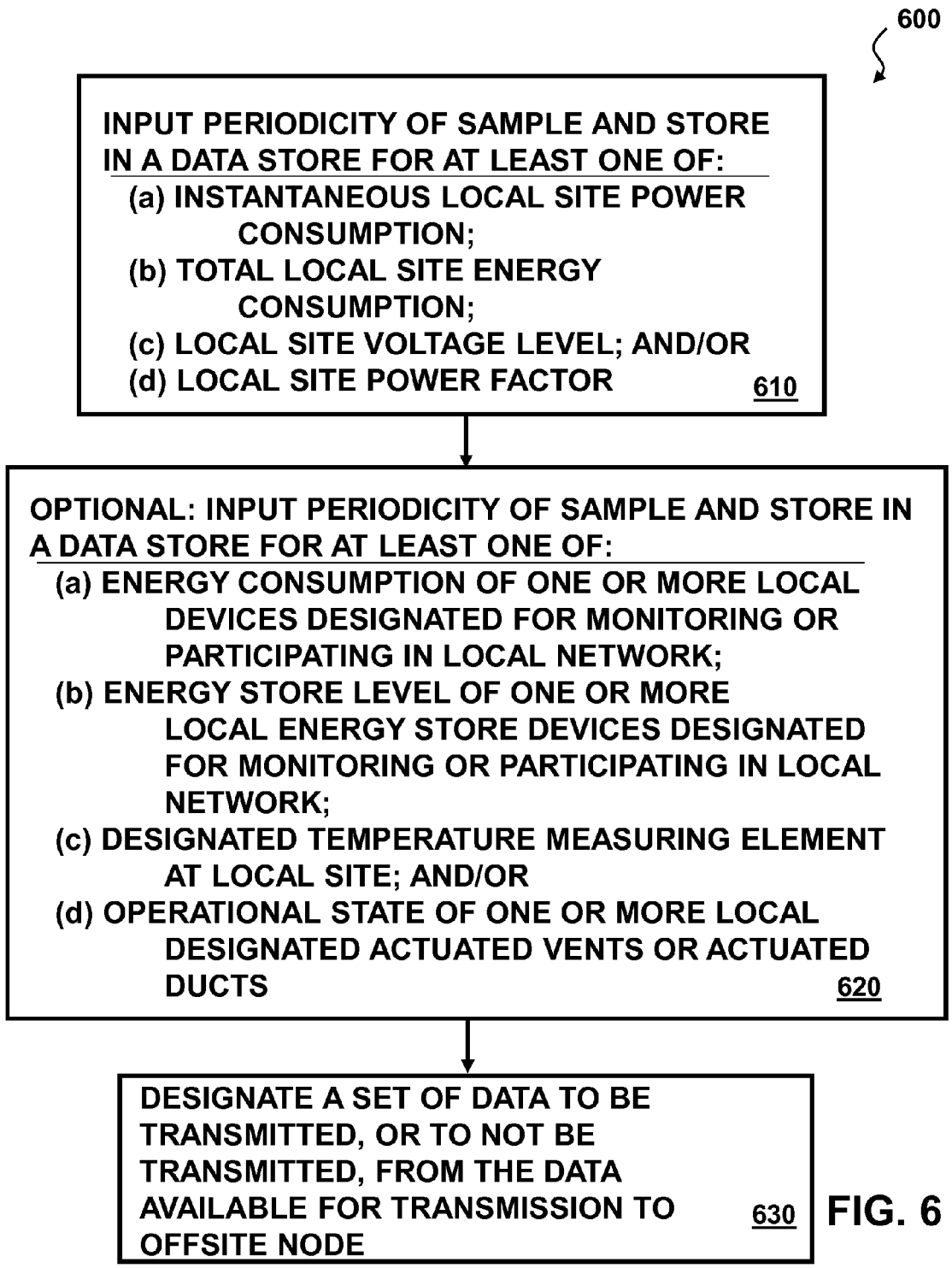
FIG. 6 is a flowchart depicting an exemplary method of use embodiment.

FIG. 6 is a flowchart 600 depicting an exemplary method of use embodiment for the system where a user may input a sample rate or measurement interval for sampling and storing (step 610) for at least one of: (a) the instantaneous local site power consumption; (b) the total local site energy consumption; (c) the local site voltage level; and/or (d) the local site power factor. Optionally, the user may input a sample rate or measurement interval for sampling and storing (step 620) for at least one of: (a) energy consumption of one or more local devices designated for monitoring or participating in a local network; (b) energy store level of one or more local energy store devices designated for monitoring or participating in the local network; (c) a designated temperature measuring element at the local site; and/or (d) the operational state of one or more local designated actuated vents or actuated ducts. The user may also designate (step 630) a set of data to be allowed to be transmitted from the local data store or stores to an offsite node.

It is contemplated that various combinations and/or sub-combinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further it is intended that the scope of the present invention herein disclosed by way of examples should not be limited by the particular disclosed embodiments described above.

What is claimed is:

1. A method comprising:
sampling, by a local processing device, energy consumption related data of a local site based on data derived and sampled periodically via a sampling operation, the sampling operation comprising a first sampling rate;
determining, by the local processing device, usage statistics of a set of local devices participating in a residential local area network system via tracking the set of local devices;
storing, at a first local data store of the local processing device, energy consumption related data of the local site and storing, at a second auxiliary data store, usage statistics of the set of local devices, wherein the energy consumption related data and usage statists are based on the first sampling rate;
filtering, by the local processing device, the stored data in order to select which of the energy consumption related data is for transmission and based on a defined rule, wherein the defined rule is based on a user selection and a provided incentive associated with the energy consumption related data and usage statistics transmitted by the local site;
determining the provided incentive associated with the energy consumption related data and usage statistics transmitted by the local site, based on an energy utility offering a larger discount for receiving more detailed energy consumption related data and usage statistics from the local site, wherein the energy consumption related data and the usage statistics comprise local site content information related to customer-sensitive information;
maintaining privacy and preventing possible misuse of detailed energy consumption related data based on filtering stored energy consumption related data of the local site, wherein the detailed energy consumption related data is collected and transmitted by a local instrumented meter; and
transmitting, by the local processing device, the filtered data and usage statistics based on data extracted periodically via a sampling operation, the sampling operation comprising a second sampling rate, wherein the first sampling rate is equal to or higher than the second sampling rate and wherein transmitting the filtered data is during a billing time that is part of a billing cycle, thereby providing the local site control of the content information related to customer-sensitive information and frequency of transmission of the data.

2. The method of claim 1 wherein the energy consumption related data of the local site comprises at least one of: (a) instantaneous local site power consumption value; (b) total local site energy consumption value; (c) local site voltage level; and/or (d) local site power factor.

3. The method of claim 1 wherein the energy consumption related data of the local site comprises at least one of: (a) energy consumption value of one or more monitored local devices; (b) energy store level of one or more monitored local energy store devices; (c) temperature measurements of the local site; (d) operational state information of one or more local actuated vents; and (e) operational state information of one or more local actuated ducts.

4. The method of claim 1 wherein the defined rule comprises at least one of:
(a) allow monthly time-of-day power consumption totals for transmission; and (b) allow daily time-of-day power consumption totals for transmission.

5. A system comprising:
a processor and data store comprising a defined rule, wherein the processor is configured to:
sample, at a first sample rate, energy consumption related data of a local site based on data derived and sampled periodically via a sampling operation, the sampling operation comprising the first sampling rate;
determine usage statistics of a set of local devices participating in a residential local area network system via tracking the set of local devices;
store, at the data store, energy consumption related data of the local site and usage statistics of the set of local devices based on the first sampling rate;
filter the stored data in order to select which of the energy consumption related data is for transmission and based on the defined rule, wherein the defined rule is based on a user selection and a provided incentive associated with the energy consumption related data and usage statistics transmitted by the local site;
determine the provided incentive associated with the energy consumption related data and usage statistics transmitted by the local site, based on an energy utility offering a larger discount for receiving more detailed energy consumption related data and usage statistics from the local site, wherein the energy consumption related data and the usage statistics comprise local site content information related to customer-sensitive information;
maintain privacy and prevent possible misuse of detailed energy consumption related data based on the filtered stored energy consumption related data of the local site, wherein the detailed energy consumption related data is collected and transmitted by a local instrumented meter; and
transmit, at a second sample rate, the filtered data and usage statistics based on data extracted periodically via a sampling operation, the sampling operation comprising the second sampling rate, wherein the first sampling rate is equal to or higher than the second sampling rate and wherein the processor is configured to transmit the filtered data during a billing time that is part of a billing cycle, thereby to provide the local site control of the content information related to customer-sensitive information and frequency of transmission of the data.

6. The system of claim 5 wherein the energy consumption related data of the local site comprises at least one of: (a) instantaneous local site power consumption value; (b) total local site energy consumption value; (c) local site voltage level; and/or (d) local site power factor.

7. The system of claim 5 wherein the energy consumption related data of the local site comprises at least one of: (a) energy consumption value of one or more monitored local devices; (b) energy store level of one or more monitored local energy store devices; (c) temperature measurements of the local site; (d) operational state information of one or more local actuated vents; and (e) operational state information of one or more local actuated ducts.

8. The system of claim 5 wherein the defined rule comprises at least one of:
(a) allow monthly time-of-day power consumption totals for transmission; and (b) allow daily time-of-day power consumption totals for transmission.

9. The method of claim 1 wherein the filtering, by the local processing device, the stored data based on a defined rule is further based on a remuneration schedule wherein the remuneration schedule is a fee schedule that is determined by an energy utility bill generator.

10. The method of claim 1 wherein the first sampling rate and the second sampling rate are each a measurement interval for sampling and storing energy consumption related data.

11. The method of claim 1 wherein the defined rule further limits the energy consumption data information that is to be transmitted based on decimating filter conditions wherein the data of the local site for allowable transmission contains less data information than the original data information.

12. The system of claim 5 wherein the processor is further configured to
store, at the data store, energy consumption related data of the local site based on a remuneration schedule wherein the remuneration schedule is a fee schedule that is determined by an energy utility bill generator.

13. The system of claim 5 wherein the first sampling rate and the second sampling rate are each a measurement interval for sampling and storing energy consumption related data.

14. The system of claim 5 wherein the defined rule further limits the energy consumption data information that is to be transmitted based on decimating filter conditions wherein the data of the local site for allowable transmission contains less data information than the original data information.

15. The method of claim 1 wherein the usage statistics of the set of local devices participating in the residential local area network system is a time of day energy consumption of the set of local devices.

16. The method of claim 1 wherein the first sampling rate and the second sampling rate are user configurable, thereby effecting delayed transmission of the filtered energy consumption information data.

17. The method of claim 1 further comprising:
determining an estimation of which residents were home within a particular timeframe based on the tracked set of devices participating in the residential local area network system and on data related to the devices connected to the residential local area network system, wherein the data related to the devices comprises which devices were being used and an exact time of day of usage of the connected devices.

18. The method of claim 1 wherein the user is at least one of: a resident of the local site and a system administrator of the local site.

19. The method of claim 1 wherein the user selection is based on at least one of: time intervals; time schedules; and time frequencies.

20. The method of claim 17 wherein the customer-sensitive information comprises time slots associated with appliance usages of each of the residents.

* * * * *